(12) United States Patent
Kume et al.

(10) Patent No.: US 6,663,414 B2
(45) Date of Patent: Dec. 16, 2003

(54) LEAD WIRE-PROCESSING STRUCTURE

(75) Inventors: Hideki Kume, Osaka (JP); Teruaki Sogawa, Osaka (JP); Takayuki Murakami, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 261 days.

(21) Appl. No.: 09/874,436

(22) Filed: Jun. 5, 2001

(65) Prior Publication Data

US 2001/0052424 A1 Dec. 20, 2001

(30) Foreign Application Priority Data

Jun. 6, 2000 (JP) ..................... P2000-169662

(51) Int. Cl.⁷ ............................... H01R 13/58
(52) U.S. Cl. ....................... 439/458; 361/826
(58) Field of Search ................. 439/457, 458, 439/459, 942, 449, 860; 174/250, 251, 255, 262–266; 361/826, 772, 773, 774, 824

(56) References Cited

U.S. PATENT DOCUMENTS 3,419,670 A * 12/1968 Schneider ................... 174/135
3,887,904 A *  6/1975 Krag ........................... 365/55
6,093,036 A *  7/2000 Tohgo et al. ................. 439/83

FOREIGN PATENT DOCUMENTS

JP          62-168685          10/1987

* cited by examiner

*Primary Examiner*—Lynn Feild
*Assistant Examiner*—Son V. Nguyen
(74) *Attorney, Agent, or Firm*—Rosenthal & Osha L.L.P.

(57) ABSTRACT

Lead wires (10) are soldered at their one ends respectively to lands (120) on a wiring board (100) while the other ends of the lead wires are connected to an electrical part mounted on a movable member (200). A portion of each of the lead wires (10) is passed through a U-shaped notch (130) in the wiring board (100), and a loop portion (16), formed at another portion of each lead wire (10), is loosely fitted on a projected piece portion (140) of the wiring board (100).

7 Claims, 3 Drawing Sheets

(PRIOR ART)

LEAD WIRE-PROCESSING STRUCTURE

BACKGROUND OF THE INVENTION

1. Field of the Invention

This invention relates to a wire processing structure for lead wires.

2. Description of the Related Art

JP-A-61-136294 discloses a construction in which one ends of wires are soldered respectively to copper foil portions on a printed circuit board, and the other ends of the wires are connected to an electrical mechanism part fixedly secured to the printed circuit board, and an intermediate portion of each wire is fixed to one of a plurality of juxtaposed slits formed in the printed circuit board, and by adopting this means, variations in length of the wires are absorbed, thereby preventing the slackening of the wires.

On the other hand, JP-A-62-168685U discloses a wire processing which is effected by a structure shown in FIG. 3. In this wire processing structure, lead wires 10, soldered at their one ends respectively to lands 2 on a printed circuit board 1, are passed through a narrow, elongate slot or slit 3 formed through that portion of the printed circuit board 1 disposed near to the lands 2. An end portion 4 of the slit 3 is formed into a step-shape. As will be appreciated from FIG. 3, the slit 3 has a width H1 and a width H2 which are larger than a wire width of the wire 10, and the withdrawal of the wires, passed through the slit 3, is prevented by the step-shaped end portion 4 of the slit 3.

However, although the technique, disclosed in JP-A-61-136294, is effective when variations in length of the wires are very small, and for example, are within the tolerance range, it cannot deal with the problem when the length variation range is wide.

With respect to the technique disclosed in JP-A-62-168685U and described with reference to FIG. 3, when the other ends of the wires 10 are connected to an electrical part mounted on a movable member, the swaying movement of the wires 10, following the movable member, is transmitted to the soldered portions of the lands 2 since the width (H1 and H2) of any portion of the slit 3 is larger than the wire width of the wire 10, and as a result there are high possibilities that the wires 10 are cut and that the lands 2 are separated from the printed circuit board. And besides, the withdrawal of the wires 10, passed through the slit 3, is prevented merely by the step-shaped end portion 4 of the slit 3 having the width H2 slightly larger than the wire width, and therefore there is a possibility that the withdrawal prevention effect is not satisfactorily achieved. Furthermore, when soldering the one end of the wire 10, passed through the slit 3, to the land 2, the wire 10 can move in the slit, so that the soldering operation can not always be carried out easily.

SUMMARY OF THE INVENTION

This invention has been made under the above circumstances, and an object of the invention is to provide a lead wire-processing structure in which when the lead wires are too long, the lead wires can be installed or arranged in an orderly manner while absorbing excess-length portions of these wires.

Another object of the invention is to provide a lead wire-processing structure in which when one end of each lead wire is soldered to a land on a wiring board, and when the other end of the lead wire sways, effects of this swaying movement will not be transmitted to the soldered portion.

A further object of the invention is to provide a lead wire-processing structure in which even when the lead wires are connected to an electrical part mounted on a movable member, the movement of the movable member can be effectively absorbed by the flexible deformation of the lead wires.

A still further object of the invention is to provide a lead wire-processing structure in which the lead wires will not be taken apart.

According to the present invention, there is provided a lead wire-processing structure CHARACTERIZED in that lead wires are soldered at their one ends respectively to lands formed on one side of a wiring board while the other ends of the lead wires are connected to an electrical part; and those portions of the lead wires, disposed in the vicinity of the one ends thereof, are extended respectively from the lands in generally contiguous relation to the one side of the wiring board, and are passed through a slit-like, U-shaped notch formed in the wiring board; and that portion of each of the lead wires, extending from the U-shaped notch on the other side of the wiring board, has a loop portion formed between a U-shaped notch-passing portion of the lead wire, passed through the U-shaped notch, and that portion of the lead wire connected to the electrical part; and the loop portions are loosely fitted on a projected piece portion of the wiring board disposed adjacent to the U-shaped notch.

In this construction, when the lead wires are too long, the radius of curvature of the loop portions can be increased and decreased, and the number of turns of each loop portion can be increased and decreased, and by doing so, the wires can be processed in an orderly manner in accordance with the excess-length portions of the lead wires. And besides, when the other ends of the lead wires sway, the loop portions satisfactorily perform the function of absorbing this swaying movement, and therefore effects of the swaying movement of the other ends of the lead wires will not be transmitted to the one ends of the lead wires. Furthermore, those portions of the lead wires, disposed in the vicinity of their one ends 11 soldered respectively to the lands on the one side of the wiring board, are extended in generally contiguous relation to the one side of the wiring board, and are passed through the U-shaped notch 130, and this arrangement also serves to prevent the effects of the swaying movement of the lead wires from being transmitted to the soldered portions.

Preferably, that portion of each of the lead wires, extending between the U-shaped notch-passing portion thereof and the loop portion thereof, is extended in generally contiguous relation to the other side of the wiring board. With this construction, the lead wires can be easily extended in an orderly manner.

The electrical part can be mounted on a movable member which is spaced from the other side of the wiring board in opposed relation thereto, and is reciprocally movable in a predetermined path. Alternatively, the electrical part can be mounted on a movable member which is spaced from the other side of the wiring board in opposed relation thereto, and is reciprocally movable toward and away from the other side of the wiring board in a path. The electrical part is, for example, a drive motor for a so-called DVD. Therefore, the lead wire-processing structure of the invention can be suitably used for connecting an electrical circuit of the wiring board to the DVD drive motor.

Preferably, an engagement piece portion for preventing the withdrawal of the loop portions is formed on the projected piece portion, and projects in a direction perpendicular to a direction of projecting of the projected piece portion.

With this construction, the loop portions will not be withdrawn from the projected piece portion, and therefore will not be taken apart.

Preferably, the U-shaped notch has an inlet/outlet portion for the lead wires, and a passage portion through which the lead wires are passed, the passage portion being continuous with the inlet/outlet portion, and a width of the inlet/outlet portion is smaller than a width of the passage portion, and is substantially equal to a width of the lead wire. With this construction, the lead wires, passed through the passage portion of the U-shaped notch, are less liable to be withdrawn from the U-shaped notch.

In the invention, the relation between the width of the inlet/outlet portion of the U-shaped notch and the wire width of the lead wire is suitably determined, thereby preventing the lead wires from being withdrawn from the U-shaped notch. The one ends of the lead wires, passed through the passage portion of the U-shaped notch, are soldered to the lands, respectively, and therefore when effecting this soldering operation, the lead wire, passed through the passage portion of the U-shaped notch, can be slightly pulled from the passage portion so that the soldering operation can be effected easily.

Preferably, the lands, the passage portion of the U-shaped notch and the projected piece portion are arranged in a juxtaposed manner along an edge of the wiring board. With this arrangement, the lead wires can be extended in an orderly manner along the edge of the wiring board.

DETAILED DESCRIPTION OF THE PREFERRED EMBODIMENTS

Now, a description will be given in more detail of preferred embodiments of the invention with reference to the accompanying drawings.

Figure 1:
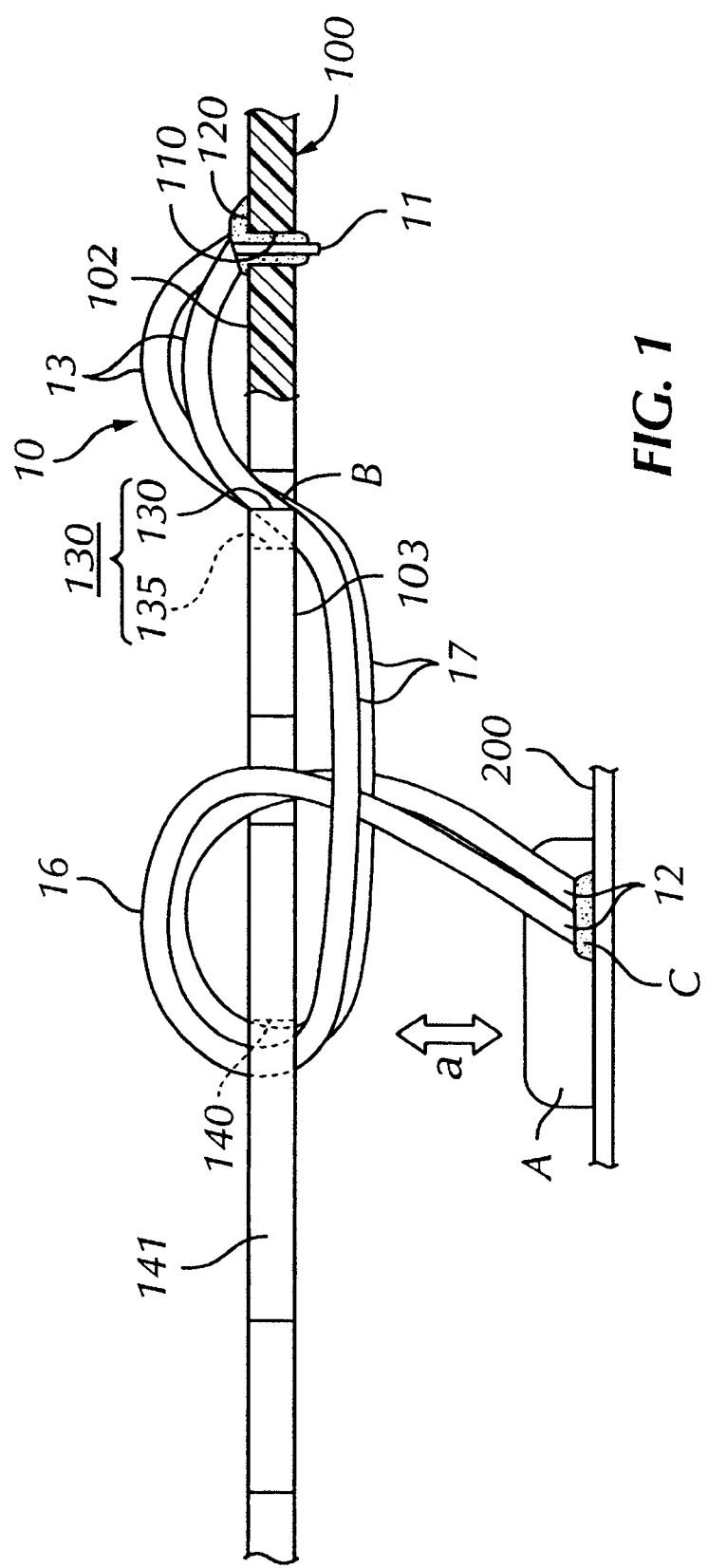
FIG. 1 is a partly-broken front-elevational view of a preferred embodiment of a lead wire-processing structure of the present invention.
Figure 2:
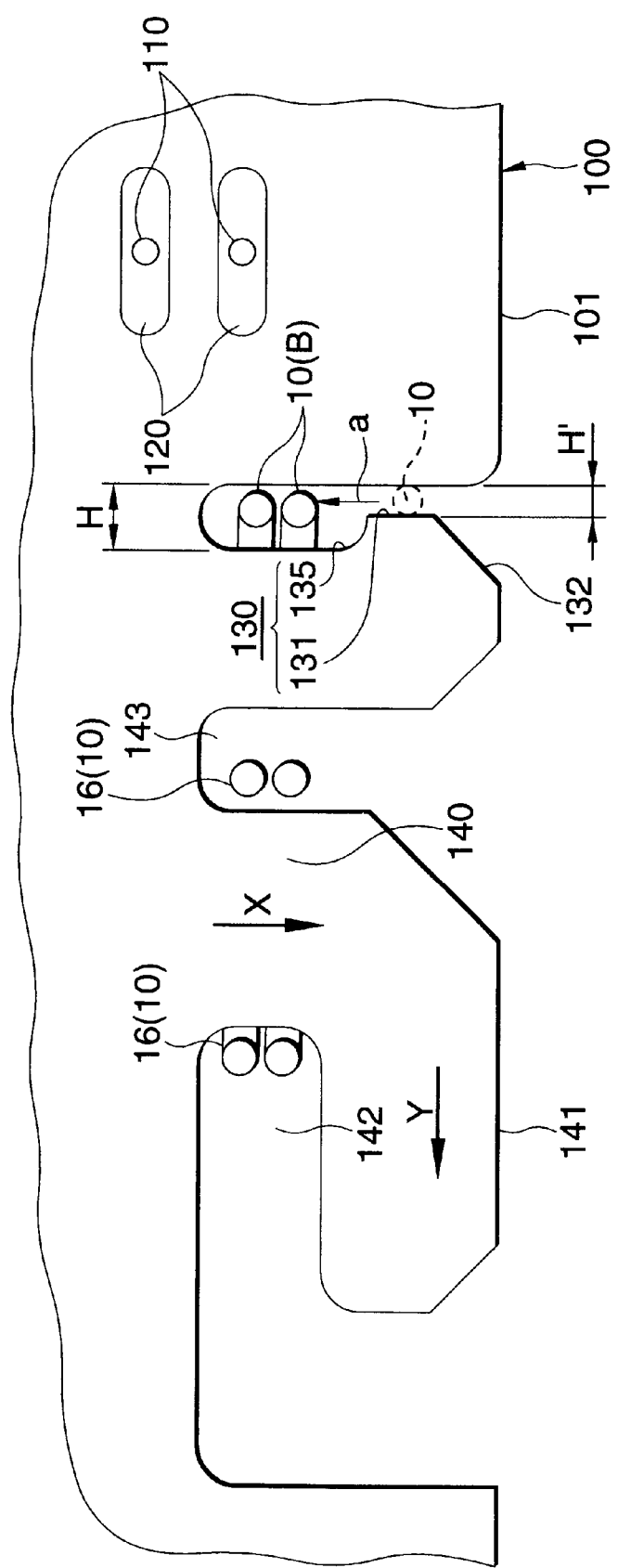
FIG. 2 is a horizontal cross-sectional, plan view of this structure.
Figure 3:
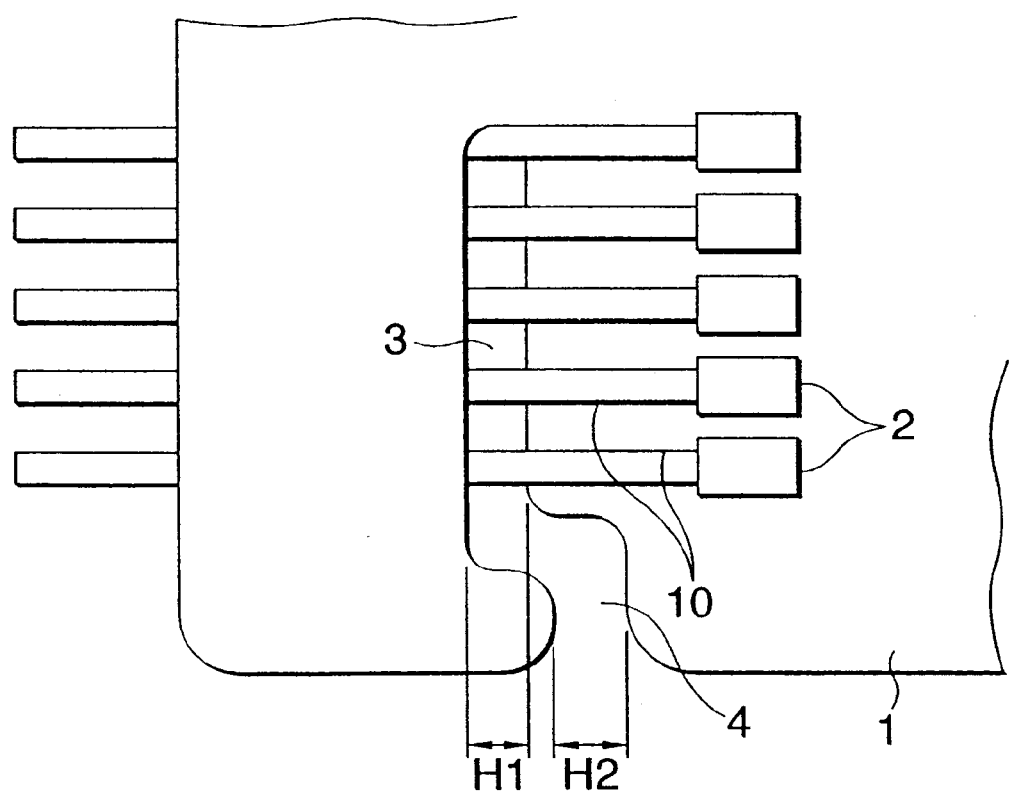
FIG. 3 is a plan view showing a conventional lead wire-processing structure.

FIG. 1 is a partly-broken, front-elevational view of a preferred embodiment of a lead wire-processing structure of the invention, and FIG. 2 is a horizontal cross-sectional, plan view of this structure.

As shown in FIG. 1, one ends 11 of lead wires 10 are inserted respectively into through holes 110, formed through a wiring board 100, and are soldered respectively to lands 120 formed respectively around the through holes 110 at one side of the wiring board 100. The other ends 12 of the lead wires 10 are connected to an electrical part A such as a motor.

As shown in FIG. 2, in addition to the lands 120, a slit-like notch 130 of a generally u-shaped contour is formed in the wiring board 100, and is disposed near to the lands 120, and further a projected piece portion 140 is formed on the wiring board, and is disposed in the vicinity of this U-shaped notch 130. The U-shaped notch 130 has an inlet/outlet portion 131 for the lead wires 10, and a passage portion 135 for the passage of the lead wires 10 therethrough which passage portion is continuous with the inlet/outlet portion 131. A width H' of the inlet/outlet portion 131 is smaller than a width H of the passage portion 135, and is substantially equal to a wire width of the lead wire 10. In the illustrated embodiment, a slanting edge 132 is formed at an outer portion of the inlet/outlet portion 131, and is slanting in an outwardly-spreading manner. Therefore, when inserting the lead wire 10 into the passage portion 135 through the inlet/outlet portion 131 as indicated by arrow a, the slanting edge 132 can be used as guide means for introducing the lead wire 10 into the inlet/outlet portion 131, and by doing so, the lead wire 10 can be inserted into the passage portion 135 through the inlet/outlet portion 131 easily and accurately. The width H of the passage portion 135 is about twice larger than the width H' of the inlet/outlet portion 131. The passage portion 135 thus has the width H' of such a dimension, and therefore when soldering the one end of the lead wire 10, passed through the passage portion 135, to the land 120, the lead wire 10 can be slightly pulled from the passage portion 135 to the one side of the wiring board 100 so that the soldering operation can be effected easily. An engagement piece portion 141 is formed integrally with the projected piece portion 140, and projects in a direction Y perpendicular to a direction X of projecting of the projected piece portion 140. The passage portion 135 of the U-shaped notch 130 and the projected piece portion 140 are juxtaposed to each other along an edge 101 of the wiring board 100, and besides the lands 120 are disposed generally in juxtaposed relation to the projected piece portion 140 and the passage portion 135.

Those portions 13 of the lead wires 10, disposed in the vicinity of their one ends 11 (which are inserted respectively in the through holes 110 in the wiring board 100, and are soldered respectively to the lands 120 (see FIG. 2), are extended respectively from the lands 120 over the one side 102 of the wiring board 100, and are passed through the passage portion 135 of the U-shaped notch 130, as shown in FIG. 1. Each of the lead wires 10 has a loop portion 16 formed between that portion B thereof (hereinafter referred to as "U-shaped notch-passing portion"), passed through the U-shaped notch, and that portion C thereof connected to the electrical part A, and this loop portion 16 is loosely fitted on the projected piece portion 140. That portion of each lead wire 10, extending between the U-shaped notch-passing portion B and the loop portion 16, is extended in generally contiguous relation to the other side 103 of the wiring board 100. Each loop portion 16 extends generally perpendicularly through the wiring board 100 from the other side 103 thereof to the one side 102 thereof at one side 142 (see FIG. 2) of the projected piece portion 140 while the loop portion 16 extends generally perpendicularly through the wiring board 100 from the one side 102 thereof to the other side 103 thereof at the other side 143 (see FIG. 2) of the projected piece portion 140. That portion of each loop portion, extending generally perpendicularly through the wiring board 100 from the one side 102 thereof to the other side 103 thereof, further extends to the electrical part A without being bent, and the other end 12 of the lead wire 10, in which this extended portion terminates, is soldered to a corresponding terminal (not shown) of the electrical part A.

The electrical part A is mounted on a movable member 200 which is spaced from the other side 103 of the wiring board 100 in opposed relation thereto, and is reciprocally movable toward and away from the other side 103 of the wiring board 100 in an approach-retreat path as indicated by arrow b.

In the above lead wire-processing structure, when the lead wires 10 are too long, the loop portions 16 of the lead wires 10 serve to hold the excess-length portions of the lead wires on the wiring board 100 so that these excess-length portions will not be taken apart. By increasing and decreasing the radius of curvature of the loop portions 16 and by increasing and decreasing the number of turns of the loop portion 16 of each lead wire 10 (In the illustrated embodiment, the number of turn is one), the wires can be processed in an orderly manner in accordance with the excess-length portions of the lead wires 10 regardless of whether the excess-length portions are short or long. The swaying movement of the other ends 12 of the lead wires 10, developing when the movable member 200 reciprocally moves in the approach-retreat path as indicated by arrow b, is easily absorbed by the flexible deformation of the loop portions 16, and therefore the swaying movement of the other end 12 of each lead wire 10 will not be transmitted to the one end 11 thereof, and its soldered portion will not be cut, and a copper foil of the land 120 will not be separated from the wiring board. And besides, those portions 13 of the lead wires 10, disposed in the vicinity of their one ends 11, are extended over the one side 102 of the wiring board 100, and are passed through the passage portion 135 of the U-shaped notch 130, and this arrangement also serves to prevent the effects of the swaying movement of the lead wires 10 from being transmitted to those portions of the lead wires soldered respectively to the lands 120.

Even when the loop portions 16 are flexibly deformed upon swaying movement of the other ends 12 of the lead wires 10, the withdrawal of the loop portions 16 from the projected piece portion 140 is prevented by the engagement piece portion 141. Therefore, the loop portions 16 will not be withdrawn from the projected piece portion 140, and will not be taken apart. And besides, the width H' of the inlet/outlet portion 131 of the U-shaped notch 130 is substantially equal to the wire width of the lead wire, and therefore the U-shaped notch-passing portions B of the lead wires, passed through the passage portion 135 of the U-shaped notch 130, will not be easily withdrawn from the passage portion 135.

In the above lead wire-processing structure, the electrical part A, mounted on the movable member 200, is, for example, a drive motor for a DVD.

In this embodiment, although the electrical part A is mounted on the movable member 200 which is reciprocally movable in the approach-retreat path in the direction of arrow b, the movable member 200 may be movable in a horizontal path or an inclined path along the other side 103 of the wiring board 100. The electrical part A may be mounted on a fixed member such as a chassis.

As described above, in the present invention, when the lead wires are too long, the lead wires can be installed or arranged in an orderly manner while absorbing excess-length portions of these wires. And besides, the effects of the swaying movement of the lead wires will not be transmitted to the soldered portions, that is, the one ends of the lead wires, so that each lead wire will not be cut at the soldered portion and that each land (copper foil) will not be separated from the wiring board. These advantageous effects can be achieved also in the case where the other ends of the lead wires are connected to the electrical part mounted on the movable member. Furthermore, in the invention, the loop portions of the lead wire will not be taken apart.

What is claimed is:

1. A lead wire-processing structure, comprising lead wires are soldered at their one ends respectively to lands formed on one side of a wiring board while the other ends of said lead wires are connected to an electrical part; and first portions of said lead wires, disposed in the vicinity of said one ends thereof, are extended respectively from said lands in generally contiguous relation to said one side of said wiring board, and are passed through a slit-like, U-shaped notch formed in said wiring board; and a second portion of each of said lead wires, extending from said U-shaped notch on said other side of said wiring board, has a loop portion formed between a U-shaped notch-passing portion of said lead wires, passed through said U-shaped notch, and a third portion of said lead wires connected to said electrical part; and said loop portion are loosely fitted on a projected piece portion of said wiring board disposed adjacent to said U-shaped notch.

2. The lead wire-processing structure according to claim 1, wherein the second portion of each of said lead wires, extending between said U-shaped notch-passing portion thereof and said loop portion thereof, is extended in generally contiguous relation to said other side of said wiring board.

3. The lead wire-processing structure according to claim 1, wherein said electrical part is mounted on a movable member which is spaced from said other side of said wiring board in opposed relation thereto, and is reciprocally movable in a predetermined path.

4. The lead wire-processing structure according to claim 1, wherein said electrical part is mounted on a movable member which is spaced from said other side of said wiring board in opposed relation thereto, and is reciprocally movable toward and away from said other side of said wiring board in a path.

5. The lead wire-processing structure according to claim 1, wherein an engagement piece portion for preventing the withdrawal of said loop portions is formed on said projected piece portion, and projects in a direction perpendicular to a direction of projecting of said projected piece portion.

6. The lead wire-processing structure according to claim 1, wherein said U-shaped notch has an inlet/outlet portion for said lead wires, and a passage portion through which said lead wires are passed, said passage portion being continuous with said inlet/outlet portion, and a width of said inlet/outlet portion is smaller than a width of said passage portion, and is substantially equal to a width of said lead wire.

7. The lead wire-processing structure according to claim 6, wherein said lands, said passage portion of said U-shaped notch and said projected piece portion are arranged in a juxtaposed manner along an edge of said wiring board.

* * * * *